United States Patent
Shioda et al.

(10) Patent No.: US 11,075,122 B2
(45) Date of Patent: Jul. 27, 2021

(54) SEMICONDUCTOR DEVICE AND MANUFACTURING METHOD THEREOF

(71) Applicant: Kioxia Corporation, Minato-ku (JP)

(72) Inventors: Tomonari Shioda, Yokkaichi (JP); Takashi Ishida, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/811,065

(22) Filed: Mar. 6, 2020

(65) Prior Publication Data

US 2021/0074592 A1 Mar. 11, 2021

(30) Foreign Application Priority Data

Sep. 5, 2019 (JP) .............................. JP2019-162305

(51) Int. Cl.
| | |
|---|---|
| *H01L 21/8234* | (2006.01) |
| *H01L 23/535* | (2006.01) |
| *H01L 27/11556* | (2017.01) |
| *H01L 27/11582* | (2017.01) |

(52) U.S. Cl.
CPC .... *H01L 21/823475* (2013.01); *H01L 23/535* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 9,324,727 B2 | 4/2016 | Lee et al. | |
| 10,115,730 B1 | 10/2018 | Baraskar et al. | |
| 10,269,820 B1* | 4/2019 | Kaminaga | ......... H01L 27/11565 |
| 10,367,000 B2 | 7/2019 | Fukushima et al. | |
| 2016/0056169 A1 | 2/2016 | Lee et al. | |
| 2017/0069657 A1 | 3/2017 | Hamanaka et al. | |
| 2017/0288038 A1 | 10/2017 | Ishida et al. | |
| 2018/0122822 A1 | 5/2018 | Lee et al. | |
| 2018/0277555 A1 | 9/2018 | Fukushima et al. | |
| 2019/0067318 A1 | 2/2019 | Shioda et al. | |

FOREIGN PATENT DOCUMENTS

| | | |
|---|---|---|
| JP | 2017-55097 A | 3/2017 |
| JP | 2018-160612 A | 10/2018 |
| JP | 2019-41056 A | 3/2019 |

\* cited by examiner

*Primary Examiner* — Hsien Ming Lee
(74) *Attorney, Agent, or Firm* — Oblon, McClelland, Maier & Neustadt, L.L.P.

(57) ABSTRACT

A semiconductor device according to an embodiment includes: a semiconductor substrate including a first surface, a first contact part provided at a deeper level than the first surface, and a second contact part protruding up to a higher level than the first surface from the first contact part; a stacked body in which insulating layers and electrode layers are alternately stacked on the first surface; and a semiconductor film extending, on the second contact part, in the stacked body in a first direction perpendicular to the first surface. At an interface between the first contact part and the second contact part, a length of the first contact part in a second direction parallel to the first surface is larger than a length of the second contact part in the second direction.

11 Claims, 19 Drawing Sheets

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2019-162305, filed on Sep. 5, 2019; the entire contents of which are incorporated herein by reference.

FIELD

Embodiments of the present invention relate to a semiconductor device and a manufacturing method thereof.

BACKGROUND

Semiconductor devices include a three-dimensionally stacked semiconductor storage device in which electrode layers are stacked. Production steps of such a three-dimensionally stacked semiconductor storage device include steps of forming a hole penetrating a stacked body stacked on a semiconductor substrate and performing epitaxial growth with a semiconductor material to form a contact part. After these steps, a semiconductor film containing a memory film is formed on the contact part.

DETAILED DESCRIPTION

Embodiments will now be explained with reference to the accompanying drawings. The present invention is not limited to the embodiments.

A semiconductor device according to an embodiment includes: a semiconductor substrate including a first surface, a first contact part provided at a deeper level than the first surface, and a second contact part protruding up to a higher level than the first surface from the first contact part; a stacked body in which insulating layers and electrode layers are alternately stacked on the first surface; and a semiconductor film extending, on the second contact part, in the stacked body in a first direction perpendicular to the first surface. At an interface between the first contact part and the second contact part, a length of the first contact part in a second direction parallel to the first surface is larger than a length of the second contact part in the second direction.

There are hereafter described semiconductor storage devices each having a memory cell array in a three-dimensional structure as embodiments. Such semiconductor storage devices each is a nonvolatile semiconductor storage device with which data can be electrically erased and written at random and which can hold the contents therein thus stored even after power supply is turned off.

First Embodiment

Figure 1:
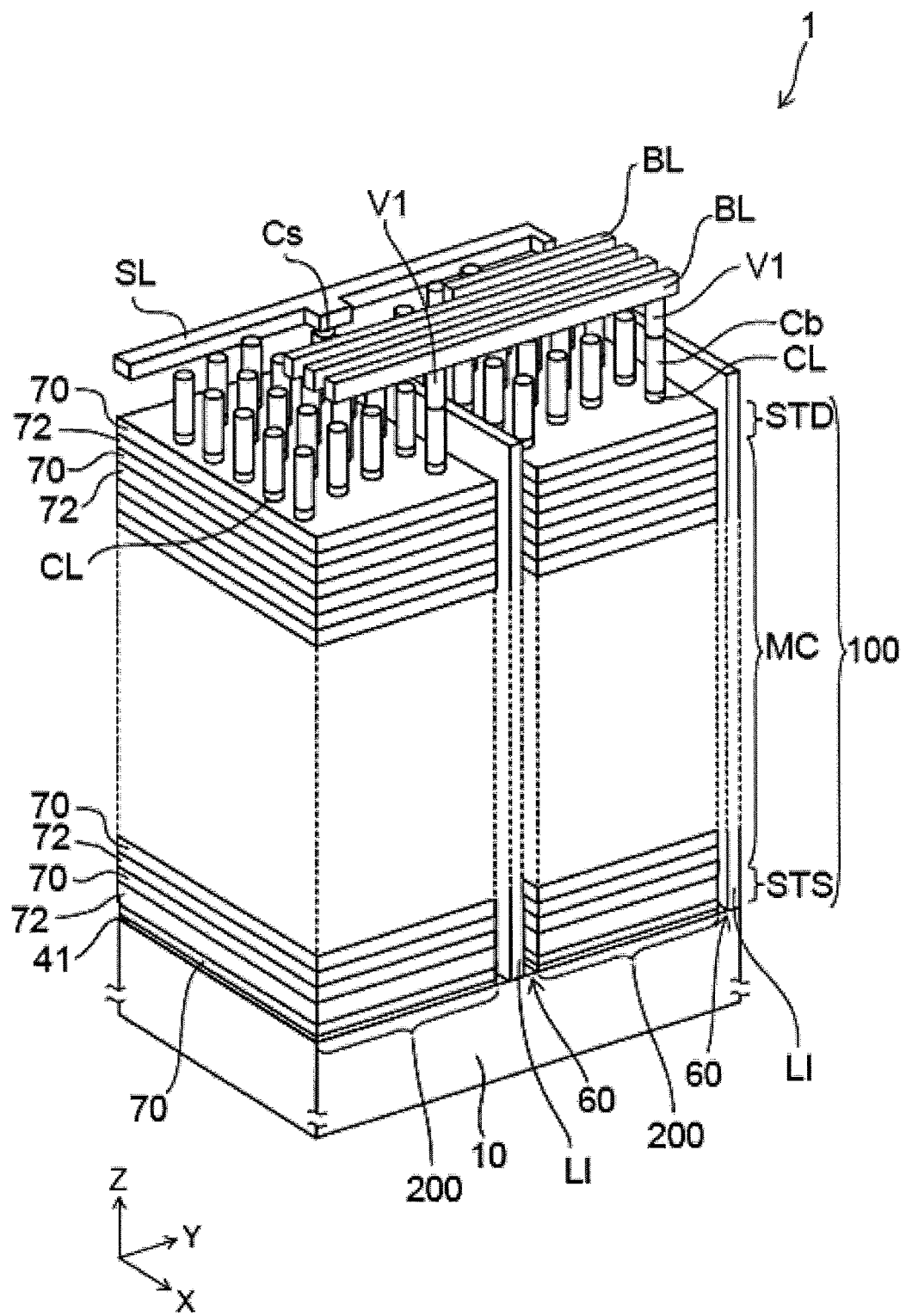
FIG. 1 is a perspective view of a memory cell array 1 according to a first embodiment.
Figure 2:
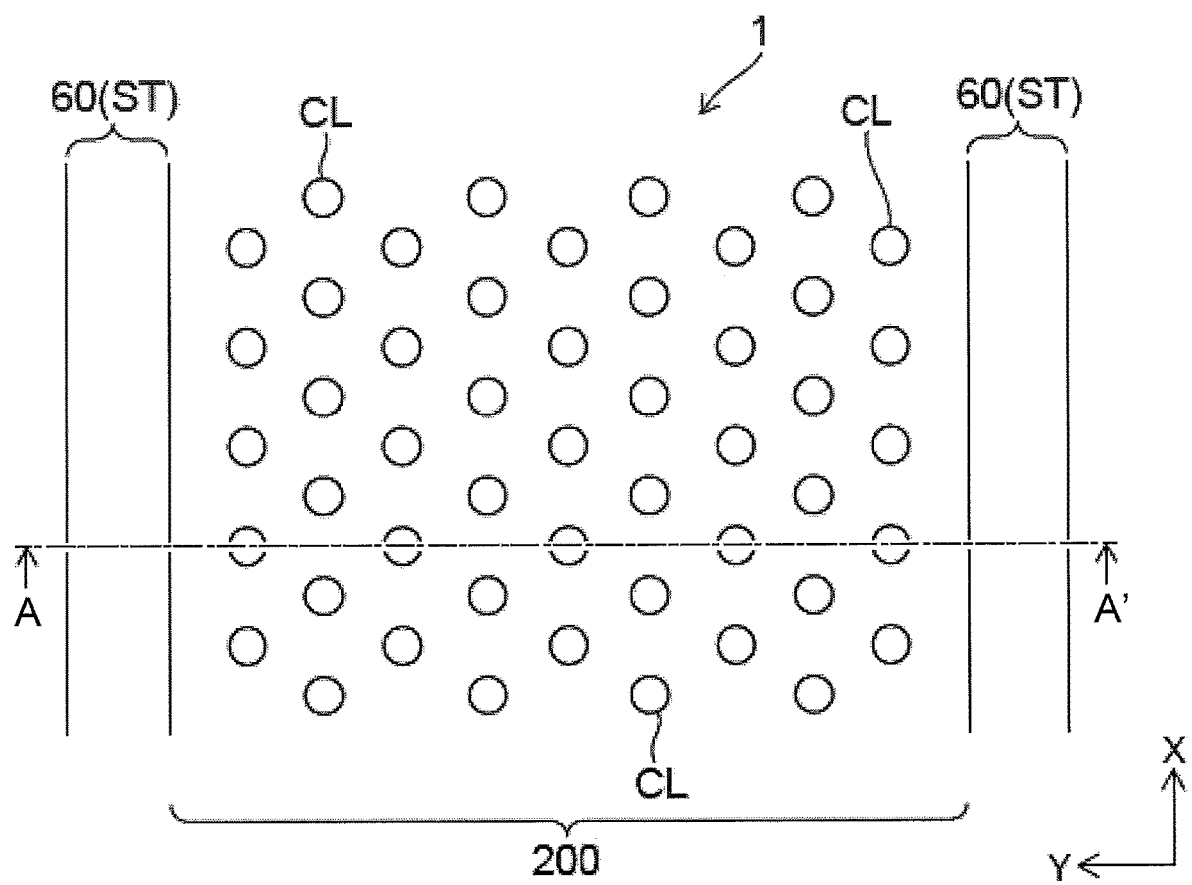
FIG. 2 is a plan view of the memory cell array 1 shown in FIG. 1.
Figure 3:
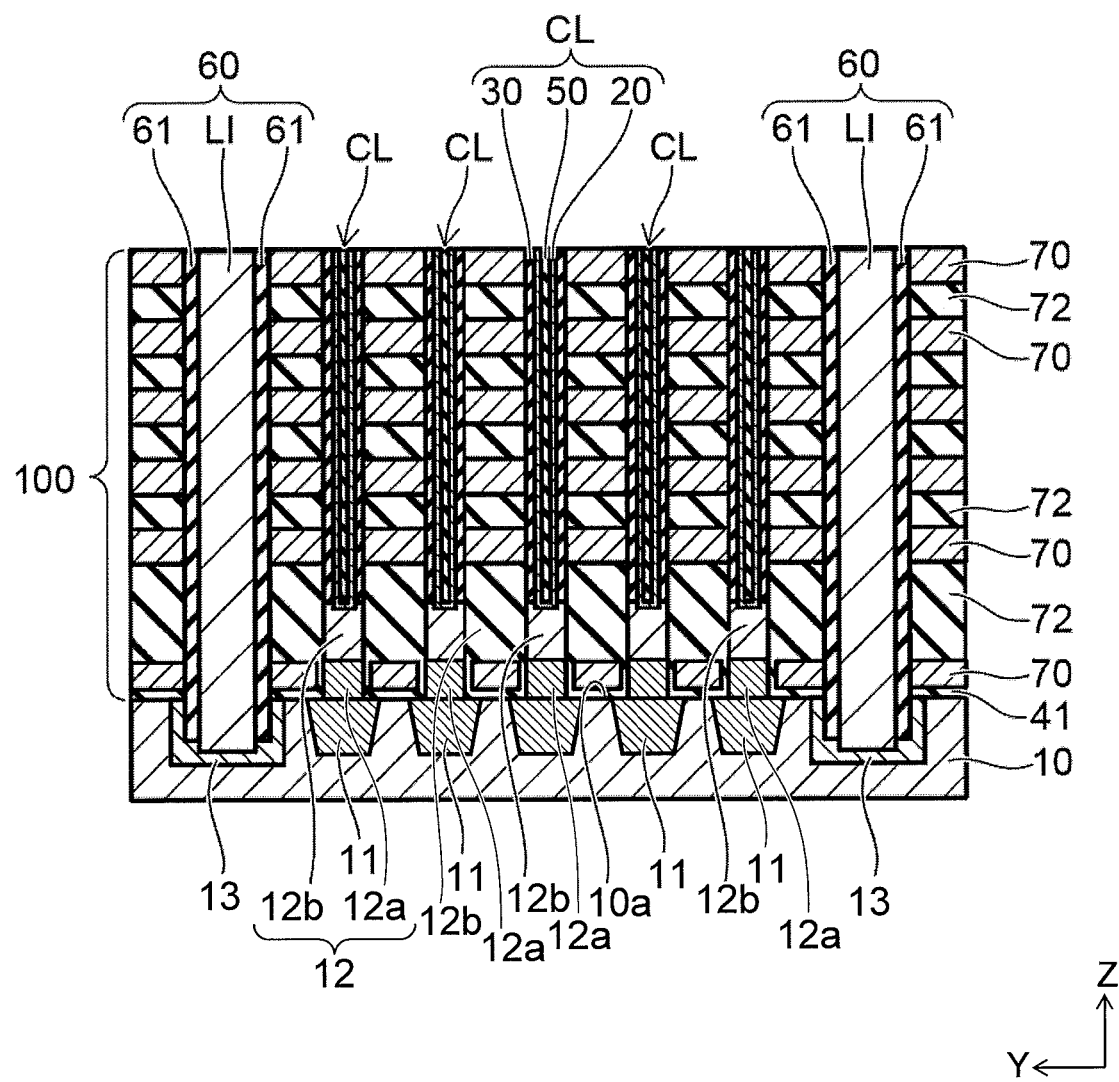
FIG. 3 is a cross sectional view taken along the sectional line A-A' shown in FIG. 2.

FIG. 1 is a perspective view of a memory cell array 1 according to a first embodiment. FIG. 2 is a plan view of the memory cell array 1 shown in FIG. 1. FIG. 3 is a cross sectional view taken along the sectional line A-A' shown in FIG. 2. In these figures, two directions which are parallel to an upper surface 10a (first surface) of a semiconductor substrate and perpendicular to each other are regarded as an X-direction and a Y-direction (second direction). Moreover, the direction which is perpendicular to the upper surface 10a and is perpendicular to the X-direction and the Y-direction is regarded as a Z-direction (first direction).

The memory cell array 1 has the semiconductor substrate 10, a stacked body 100 provided on the semiconductor substrate 10, a plurality of semiconductor films CL, a plurality of separation parts 60, bit lines BL, and a source line SL.

Each semiconductor film CL is formed into a substantial cylinder shape extending inside the stacked body 100 in the Z-direction. The separation parts 60 spread on the semiconductor substrate 10 in the Z-direction and the X-direction, and separate the stacked body 100 into a plurality of blocks (or fingers) 200 in the Y-direction. The plurality of semiconductor films CL exemplarily make a staggered arrangement as shown in FIG. 2. Notably, the plurality of semiconductor films CL may make a square lattice arrangement along the X-direction and the Y-direction.

The plurality of bit lines BL are provided above the stacked body 100. The plurality of bit lines BL extend in the Y-direction and are exemplarily metal films. The plurality of bit lines BL are separated from one another in the X-direction.

The semiconductor substrate 10 is exemplarily a silicon substrate. As shown in FIG. 3, the semiconductor substrate 10 has a plurality of first contact parts 11 and a plurality of second contact parts 12. Each of the first contact parts 11 and the second contact parts 12 is a silicon crystal layer obtained through epitaxial growth of silicon in a memory hole MH formed in and on the semiconductor substrate 10.

The first contact parts 11 are provided at a deeper level than an upper surface 10a of the semiconductor substrate 10. Moreover, the first contact parts 11 contain boron (B). Each of the second contact parts 12 has a doped layer 12a protruding up to a higher level than the upper surface 10a from the first contact part 11, and an undoped layer 12b provided on the doped layer 12a. The doped layers 12a contain boron as well as the first contact parts 11 do. Meanwhile, the undoped layers 12b do not contain boron. A concentration of boron contained in the first contact parts 11 and the doped layers 12a is preferably within a range of $1\times10^{17}$ m$^{-3}$ to $5\times10^{18}$ m$^{-3}$.

The stacked body 100 is provided on the upper surface 10a of the semiconductor substrate 10. The stacked body 100 has a plurality of electrode layers 70. The plurality of electrode layers 70 are stacked via insulating layers 72 in the Z-direction. The individual electrode layers 70 are metal layers, for example, such as tungsten layers or molybdenum layers. Moreover, an insulating layer 41 is provided between the upper surface 10a of the semiconductor substrate 10 and the lowermost electrode layer 70.

Figure 4:
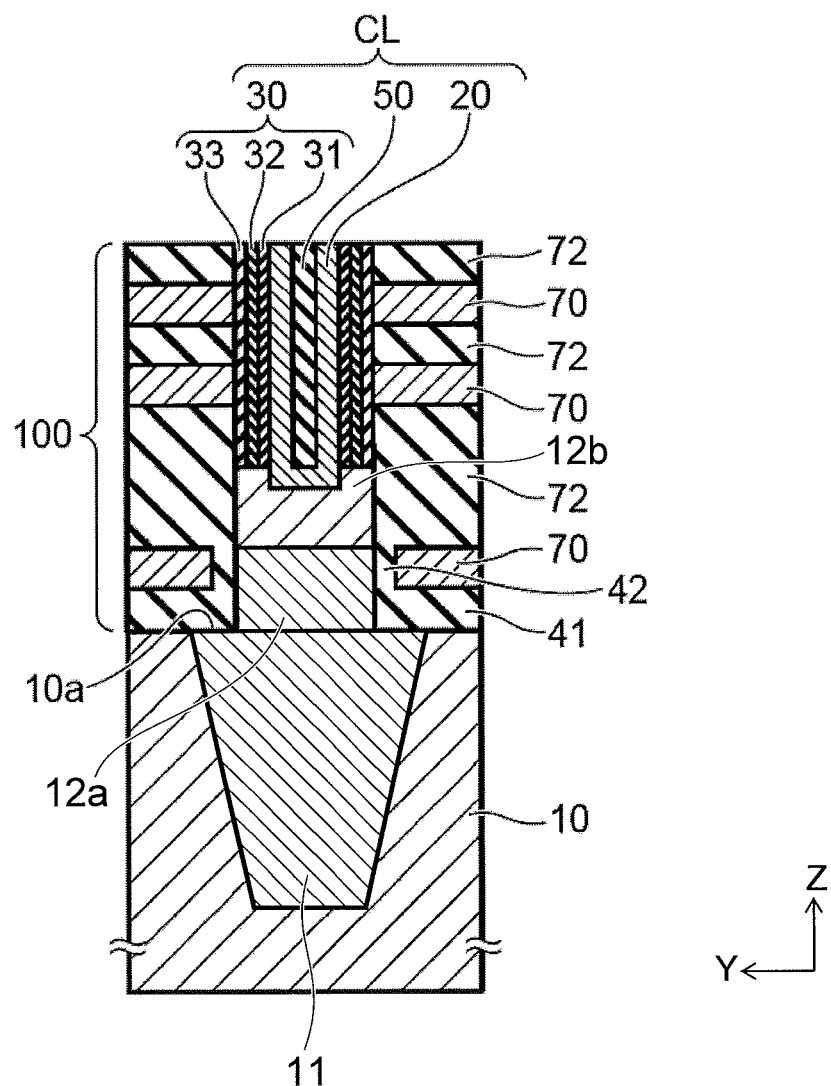
FIG. 4 is a cross sectional view having a part of FIG. 3 expanded.

FIG. 4 is a cross sectional view having a part of FIG. 3 expanded. As shown in FIG. 4, an upper end of the doped layer 12a of the second contact part 12 is at a level higher than the insulating layer 41 and lower than the lowermost electrode layer 70. Moreover, an upper end of the undoped layer 12b of the second contact part 12 is positioned between the lowermost electrode layer 70 the second lowest electrode layer 70. A distance between the upper end of the undoped layer 12b and the second lowest electrode layer 70 is shorter than a distance between the upper end of the undoped layer 12b and the lowermost electrode layer 70. The lowermost electrode layer is above the upper surface 10a of the semiconductor substrate 10, and encloses a lateral surface of the columnar second contact part 12.

The lowermost electrode layer 70 is positioned at a height below a lower end of the semiconductor film CL. Moreover, an insulating film 42 is provided between the lateral surface of the second contact part 12 and the lowermost electrode layer 70. The lateral surface of the second contact part 12 is covered by the lowermost insulating layer 72, the insulating film 42 and the insulating layer 41.

A distance between the lowermost electrode layer 70 and the second lowest electrode layer 70 is larger than distances between the other electrode layers 70. A thickness of the lowermost insulating layer 72 is larger than thicknesses of the other insulating layers 72.

As shown in FIG. 4, the semiconductor film CL has a memory film 30, a semiconductor body 20 and an insulative core film 50. The semiconductor body 20, the memory film 30 and the core film 50 extend on the second contact part 12 in the Z-direction.

The semiconductor body 20 is formed into a pipe shape, and the core film 50 is provided inward of the same. The semiconductor body 20 is exemplarily an amorphous silicon film. A lower end part of the semiconductor body 20 is in contact with the second contact part 12. An upper end of the semiconductor body 20 is connected to the bit line BL via a contact Cb and a contact V1 which are shown in FIG. 1.

The memory film 30 is provided between the electrode layers 70 above the lowermost electrode layer 70 and the semiconductor body 20, and encloses a periphery of the semiconductor body 20. The memory film 30 is a stacked film including a tunnel insulating film 31, a charge storage capacitor 32 and a block insulating film 33. The block insulating film 33, the charge storage capacitor 32 and the tunnel insulating film 31 are provided in this order from the electrode layer 70 side between the electrode layer 70 that is one layer higher than the lowermost electrode layer 70 and the semiconductor body 20. The semiconductor body 20, the memory film 30 and the electrode layer 70 constitute a memory cell MC.

The memory cell MC is exemplarily a charge trapping memory cell. The charge storage capacitor 32 has many trap sites which trap charges in the insulative film, and exemplarily includes a silicon nitride film. Otherwise, the charge storage capacitor 32 may be a floating gate with conductivity the periphery of which is enclosed by an insulator.

The tunnel insulating film 31 is a potential barrier when charges are injected into the charge storage capacitor 32 from the semiconductor body 20 or when charges stored in the charge storage capacitor 32 are released to the semiconductor body 20. The tunnel insulating film 31 exemplarily includes a silicon oxide film.

The block insulating film 33 prevents charges stored in the charge storage capacitor 32 from being released to the electrode layer 70. Moreover, the block insulating film 33 prevents back tunneling of electrons to the semiconductor film CL from the electrode layer 70. The block insulating film 33 exemplarily includes a silicon oxide film. Otherwise, as the block insulating film, a stacked film of a silicon oxide film and a metal oxide film with a higher dielectric constant than that of the silicon oxide film may be provided between the charge storage capacitor 32 and the electrode layer 70.

The memory cell MC has a vertical transistor structure in which the electrode layer 70 encloses a periphery of the semiconductor body 20 via the memory film 30. In this memory cell MC with the vertical transistor structure, the semiconductor body 20 functions as a channel, and the electrode layer 70 functions as a control gate. The charge storage capacitor 32 functions as a data storage layer which stores charges injected from the semiconductor body 20.

As shown in FIG. 1, a plurality of memory cells MC are provided between a drain-side selection transistor STD and a source-side selection transistor STS. The plurality of memory cells MC, the drain-side selection transistor STD and the source-side selection transistor STS are connected in series through the semiconductor body 20 of the semiconductor film CL, and constitute a memory string. Memory strings each thus constituted exemplarily make a staggered arrangement in a plane direction parallel to the XY-plane, and a plurality of memory cells MC are three-dimensionally provided in the X-direction, the Y-direction and the Z-direction.

Next, the separation parts 60 are described. As shown in FIG. 3, each separation part 60 has a line part LI and insulating films 61. The line part LI spreads in the X-direction and the Z-direction, and is exemplarily a film containing metal. The insulating films 61 are provided on lateral surfaces of the line part LI. The insulating film 61 is provided between the stacked body 100 and the line part LI.

As shown in FIG. 3, a plurality of semiconductor regions are formed in a surface portion of the semiconductor substrate 10. A lower end of each line part LI is in contact with the semiconductor region 13. The plurality of semiconductor regions 13 are provided to correspond to the plurality of line parts LI. The semiconductor regions 13 are exemplarily N-type silicon regions. Upper ends of the line parts LI are connected to the source line SL via contacts Cs. In operation of reading data, electrons are supplied to the semiconductor body 20 from the line part LI through the semiconductor region 13, the surface of the semiconductor substrate 10, and the second contact part 12.

The lowermost electrode layer 70 functions as a control gate of a bottom transistor, and the insulating layer 41 and the insulating film 42 shown in FIG. 4 function as gate insulating films of the bottom transistor. The bottom transistor has a structure in which the lowermost electrode layer 70 encloses a periphery of the doped layer 12a of the second contact part 12 via the insulating film 42. Moreover, the lowermost electrode layer 70 faces the upper surface 10a of the semiconductor substrate 10 via the insulating layer 41.

Control of a potential given to the lowermost electrode layer 70 induces inversion layers (N-channels), in the vicinity of the upper surface 10a of the semiconductor substrate 10 and in the vicinity of the lateral surface of the doped layer 12a of the second contact part 12, and thus, can cause a cell current to flow between the semiconductor region 13 and the lower end of the semiconductor body 20.

Hereafter, a manufacturing method of a semiconductor device according to the present embodiment is described.

Figure 5:
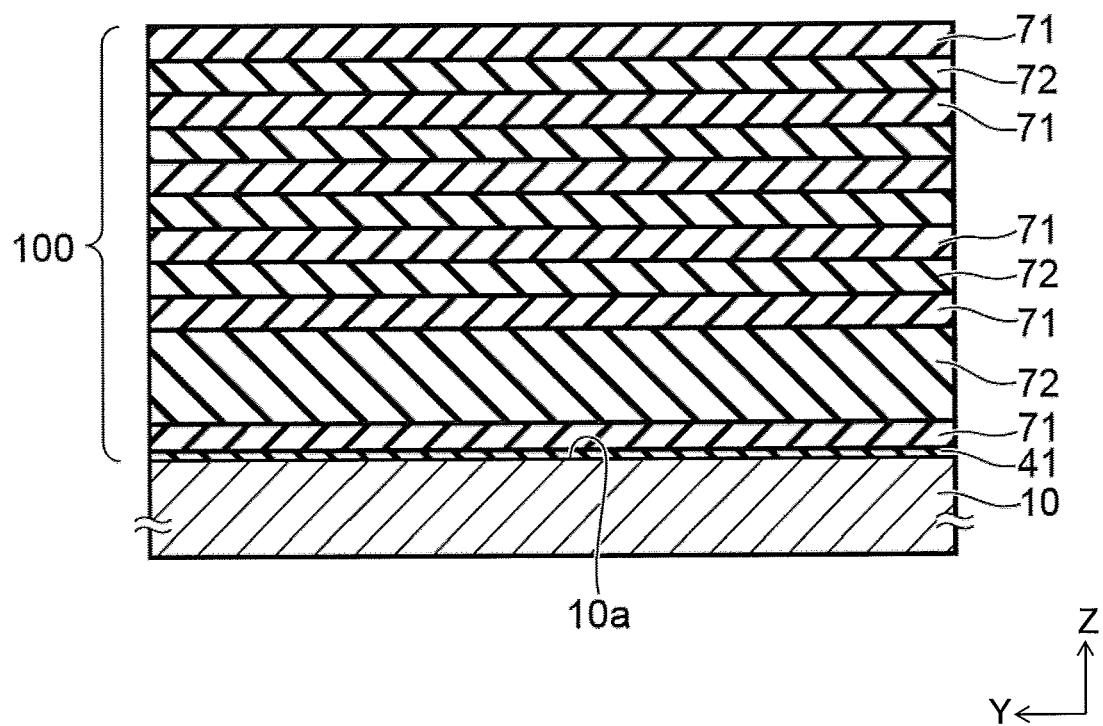
FIG. 5 is a cross sectional view showing a step of forming a stacked body.

First, as shown in FIG. 5, the insulating layer 41 is formed on the upper surface 10a of the semiconductor substrate 10, and sacrificial layers 71 and the insulating layers 72 are alternately stacked on the insulating layer 41 in the Z-direction. For example, the sacrificial layers 71 are silicon nitride layers, and the insulating layers 72 are silicon oxide layers.

Figure 6:
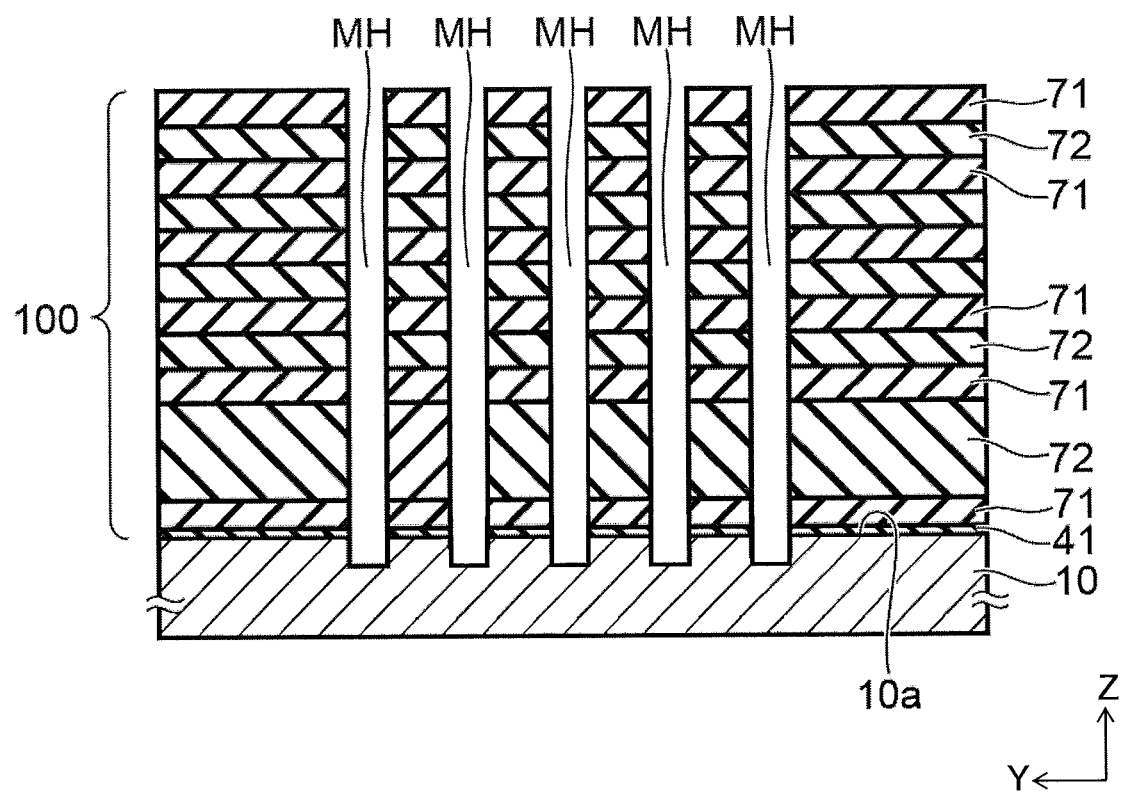
FIG. 6 is a cross sectional view showing a step of forming memory holes.

Next, as shown in FIG. 6, the plurality of memory holes MH are formed in the stacked body 100, for example, by RIE (Reactive Ion Etching) using gas containing chlorine ($Cl_2$). The memory holes MH penetrate the stacked body 100 to reach the semiconductor substrate 10.

Figure 7:
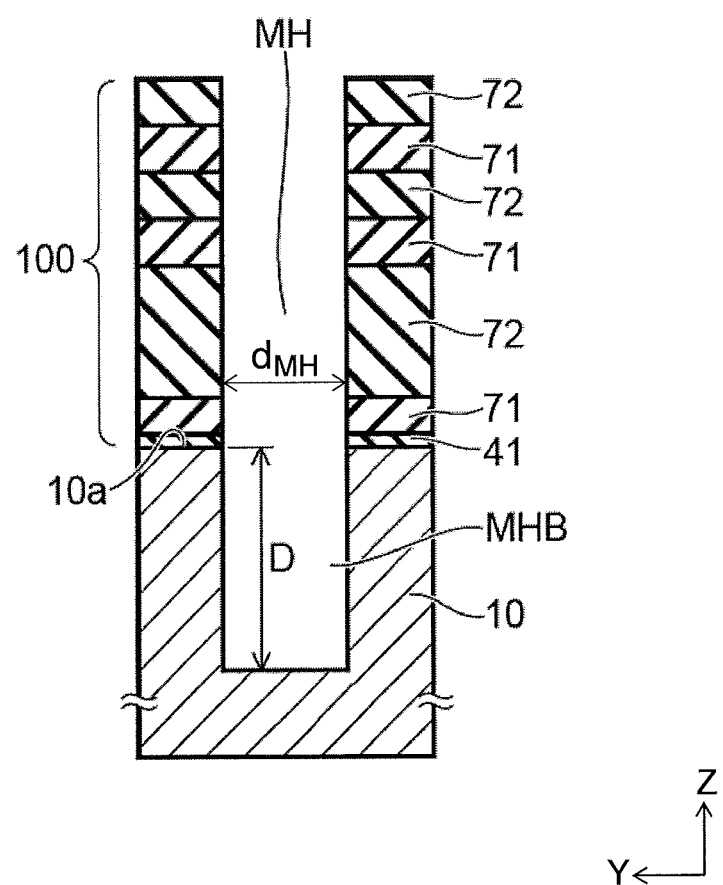
FIG. 7 is an expanded view of a memory hole.

FIG. 7 is an expanded view of one of the memory holes. As shown in FIG. 7, a bottom surface of the memory hole MH is at a deeper level than the upper surface 10a of the semiconductor substrate 10. A depth "D" of a bottom region MHB (first portion), of the memory hole MH, which is lower than the upper surface 10a is larger than a diameter "$d_{MH}$" of the memory hole MH. An aspect ratio of the bottom region MHB is larger than one. By controlling an RIE time such that the aspect ratio of the bottom region MHB is larger than one, the plurality of memory holes MH can be securely caused to reach the semiconductor substrate 10.

Figure 8:
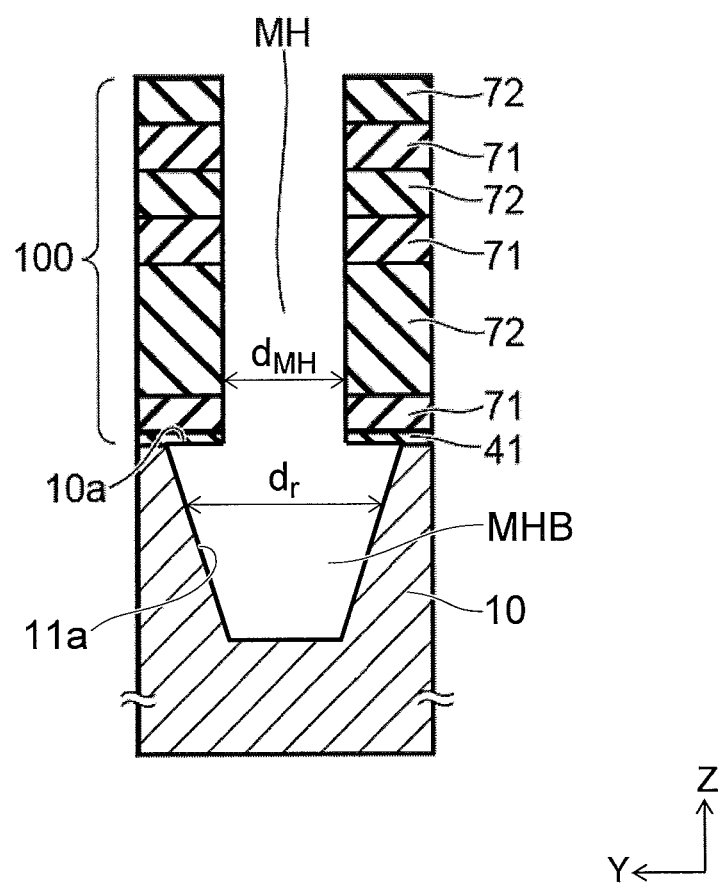
FIG. 8 is a cross sectional view showing a step of anisotropic etching of a bottom region.

Next, as shown in FIG. 8, the bottom region MHB is anisotropically etched using gas containing hydrogen chloride (HCl). A condition of the anisotropic etching is that a pressure in a chamber is not less than 5333 Pa (40 Torr) and not more than 10666 Pa (80 Torr), for example. A flow rate of the hydrogen chloride gas is not less than 1000 sccm and not more than 2000 sccm. By using process conditions as above, anisotropy of etching can be made large.

Through the aforementioned anisotropic etching, a length "$d_r$" of the bottom region MHB in the Y-direction becomes larger than the diameter "$d_{MH}$" of the memory hole MH. Moreover, there is formed on the bottom region MHB a tapered surface 11a inclined such that the aforementioned length "$d_r$" is larger as coming closer to the stacked body 100. The (111) plane of a silicon crystal is exposed on most of the tapered surface 11a. The tapered surface 11a includes (−111), (1-11) and (11-1), which are planes equivalent to (111), and the bottom region MHB has a surface shape of a quadrangular pyramid oriented downward.

Figure 9:
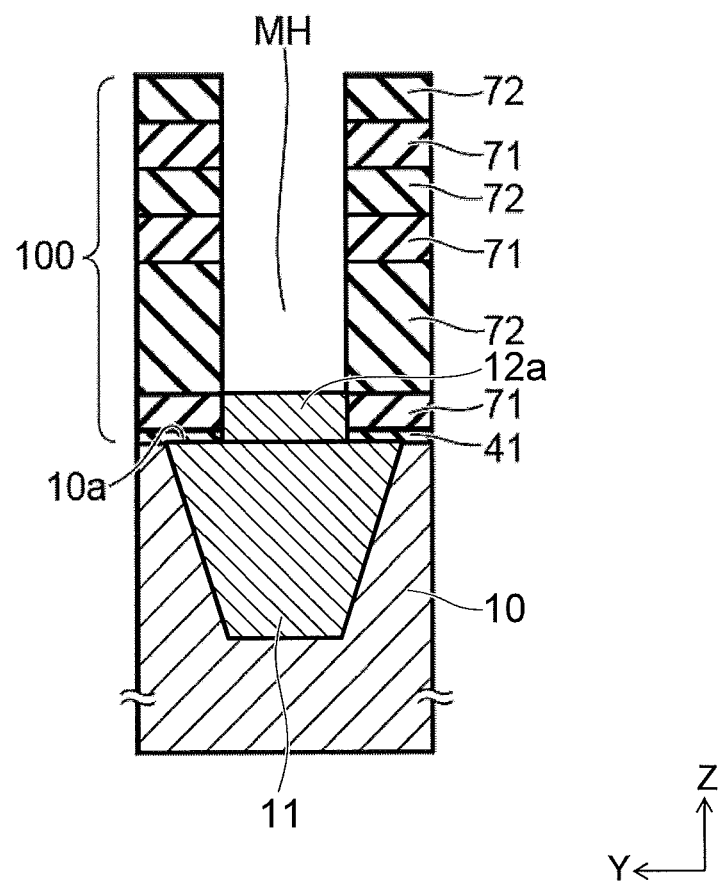
FIG. 9 is a cross sectional view showing a step of epitaxial growth of a silicon crystal and ion injection with boron.

Next, as shown in FIG. 9, in the bottom region MHB of the memory hole MH, silicon, which is the same semiconductor material as that of the semiconductor substrate 10, is epitaxially grown, and simultaneously, the silicon is doped with boron. The epitaxial growth of a silicon crystal and the doping thereof with boron are successively performed in the apparatus in which the aforementioned anisotropic etching of the bottom region MHB has been performed.

Examples of conditions of the epitaxial growth include a flow rate of dichlorosilane (DCS) gas not less than 100 sccm and not more than 400 sccm, the flow rate of the hydrogen chloride gas not less than 100 sccm and not more than 250 sccm, and the pressure in the chamber not less than 1333 Pa (10 Torr) and not more than 5333 Pa (40 Torr). The flow rate of the hydrogen chloride gas in the anisotropic etching is greater than 10 times and smaller than 20 times the flow rate of the hydrogen chloride gas in the epitaxial growth. The pressure in the anisotropic etching is greater than twice and smaller than four times the pressure in the epitaxial growth. By using process conditions as above, anisotropy of etching can be made large. Moreover, the doping with boron is ended when a height of the silicon crystal reaches that of the lowermost sacrificial layer 71. As a result, the first contact part 11 having been doped with boron is formed in the bottom region MHB, and the doped layer 12a having been doped with boron is formed on the first contact part 11.

Figure 10:
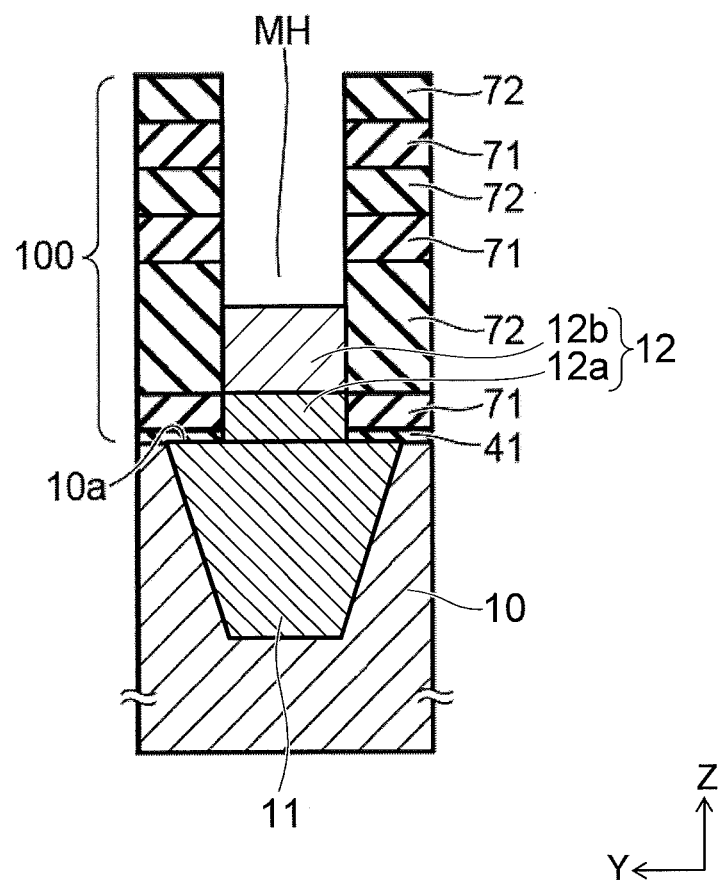
FIG. 10 is a cross sectional view showing a step of forming an undoped layer.

After the doping with boron is ended, the epitaxial growth of the silicon crystal is continued in the same apparatus for a predetermined time as shown in FIG. 10. As a result, the undoped layer 12b which is not doped with boron is formed on the doped layer 12a to complete the second contact part 12.

Figure 11:
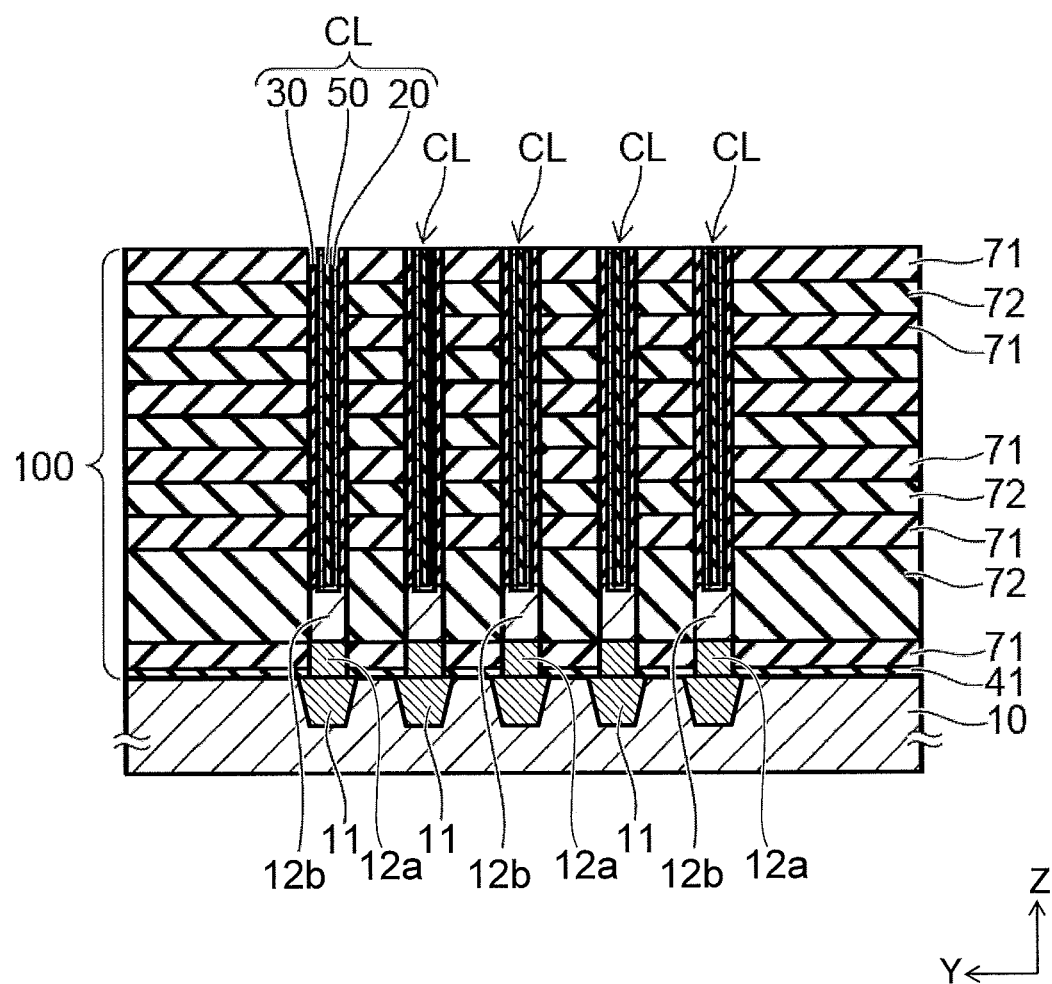
FIG. 11 is a cross sectional view showing a step of forming semiconductor films.

After the second contact parts 12 are formed, as shown in FIG. 11, the semiconductor films CL are formed on the undoped layers 12b of the second contact parts 12. Specifically, the memory films 30, the semiconductor bodies 20 and the core films 50 are sequentially formed in the memory holes MH. In this stage, the lower end parts of the semiconductor bodies 20 are in contact with the undoped layers 12b.

Figure 12:
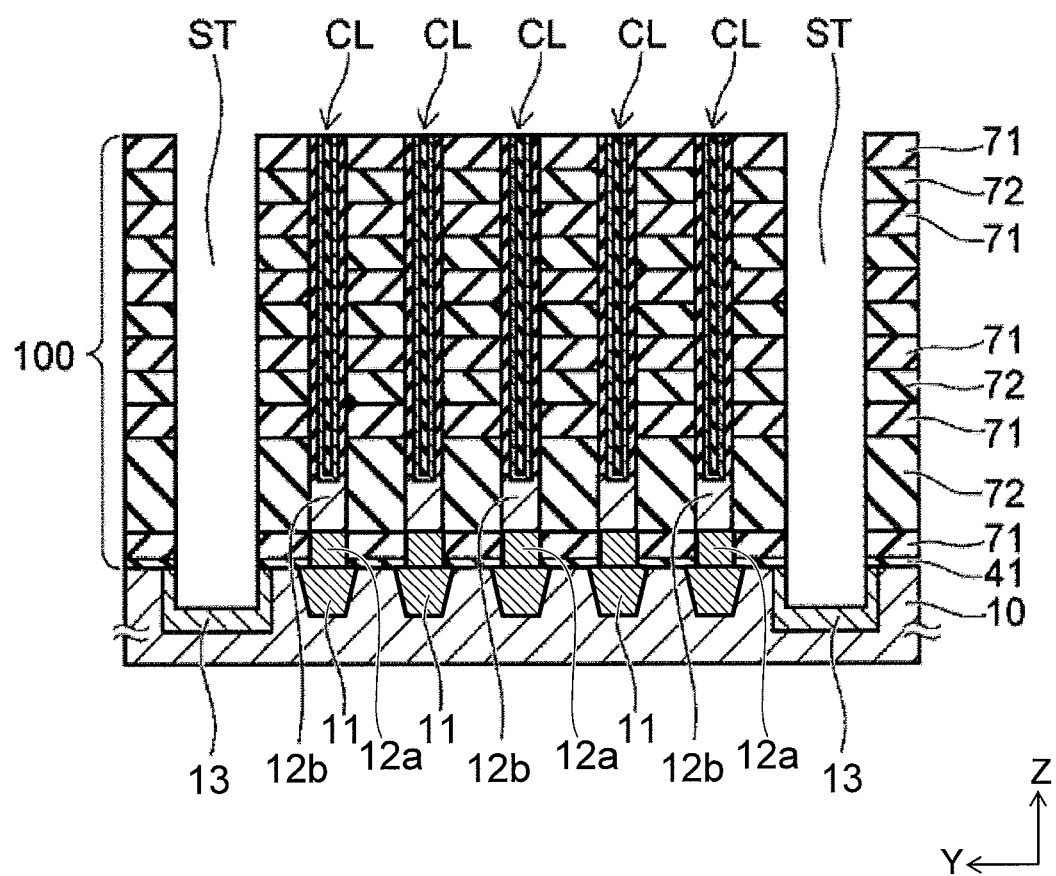
FIG. 12 is a cross sectional view showing a step of forming slits.

After the semiconductor films CL are formed, as shown in FIG. 12, a plurality of slits ST are formed in the stacked body 100. The slits ST are formed, for example, by RIE. The slits ST penetrate the stacked body 100 to reach the semiconductor substrate 10. Impurities are implanted into bottoms of the slits ST by ion injection. Thereby, the semiconductor regions 13 are formed.

Figure 13:
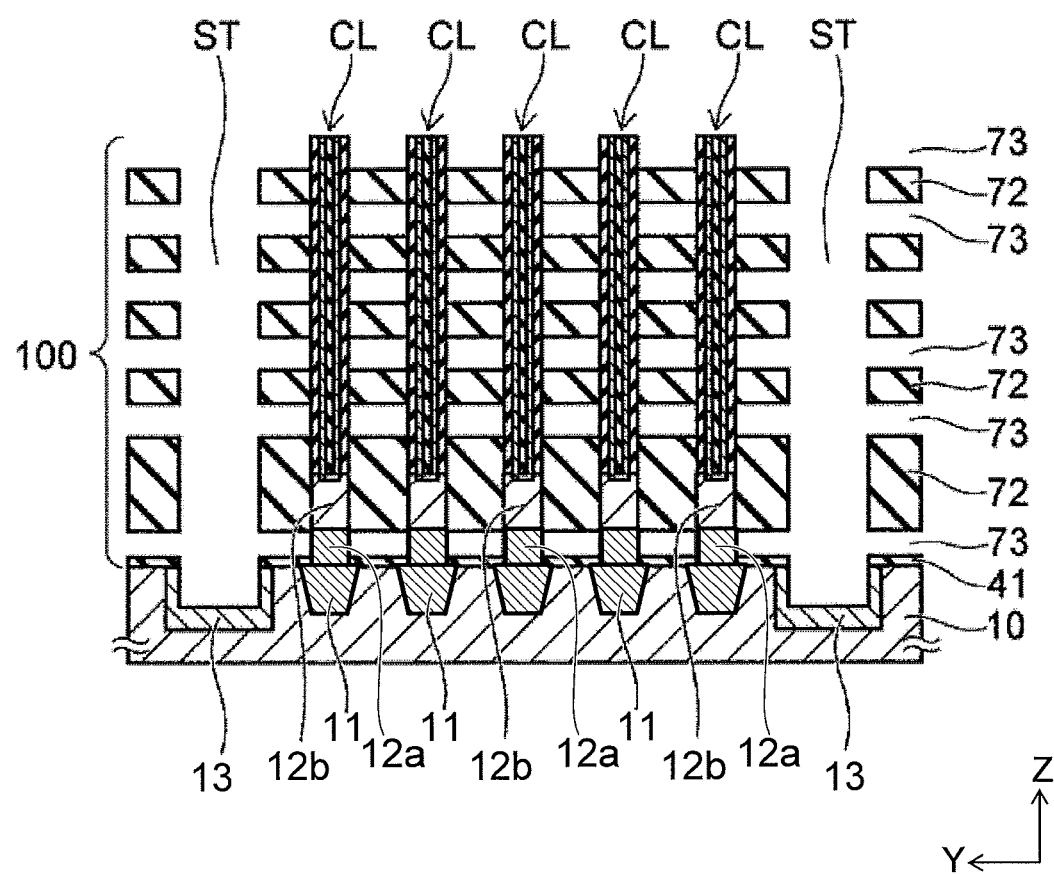
FIG. 13 is a cross sectional view showing a step of etching sacrificial layers.

Next, as shown in FIG. 13, the sacrificial layers 71 are removed with etching liquid or etching gas supplied through the slits ST. For example, etching liquid containing phosphoric acid is employed to remove the sacrificial layers 71 which are silicon nitride layers. Thereby, gaps 73 are formed between the insulating layers 72 adjacent in the Z-direction. A gap 73 is also formed between the insulating layer 41 and the lowermost insulating layer 72. In this stage, the plurality of insulating layers 72 are supported by their bonds to the semiconductor films CL, and the gaps 73 are maintained.

Figure 14:
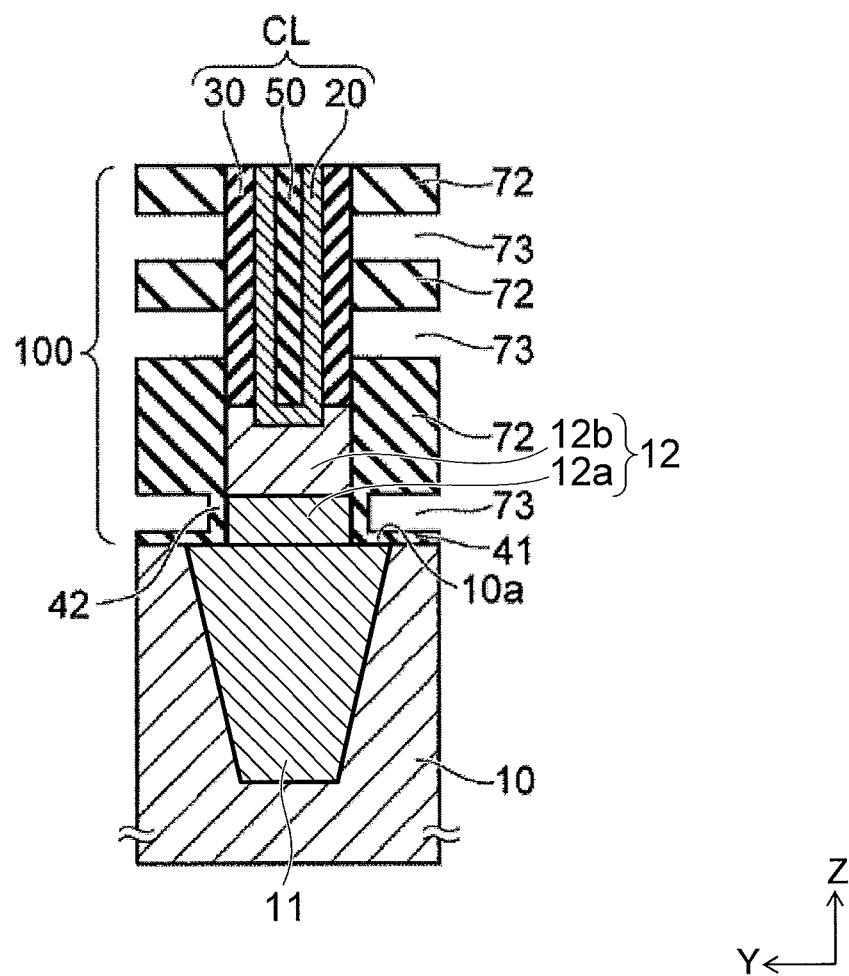
FIG. 14 is a cross sectional view showing a step of forming an insulating film.

Next, as shown in FIG. 14, insulating films (silicon oxide films) are grown on the doped layers 12a exposed from the gaps 73, for example, by a thermal oxidation method. Thereby, the insulating films 42 are formed on the lateral surfaces of the doped layers 12a.

Figure 15:
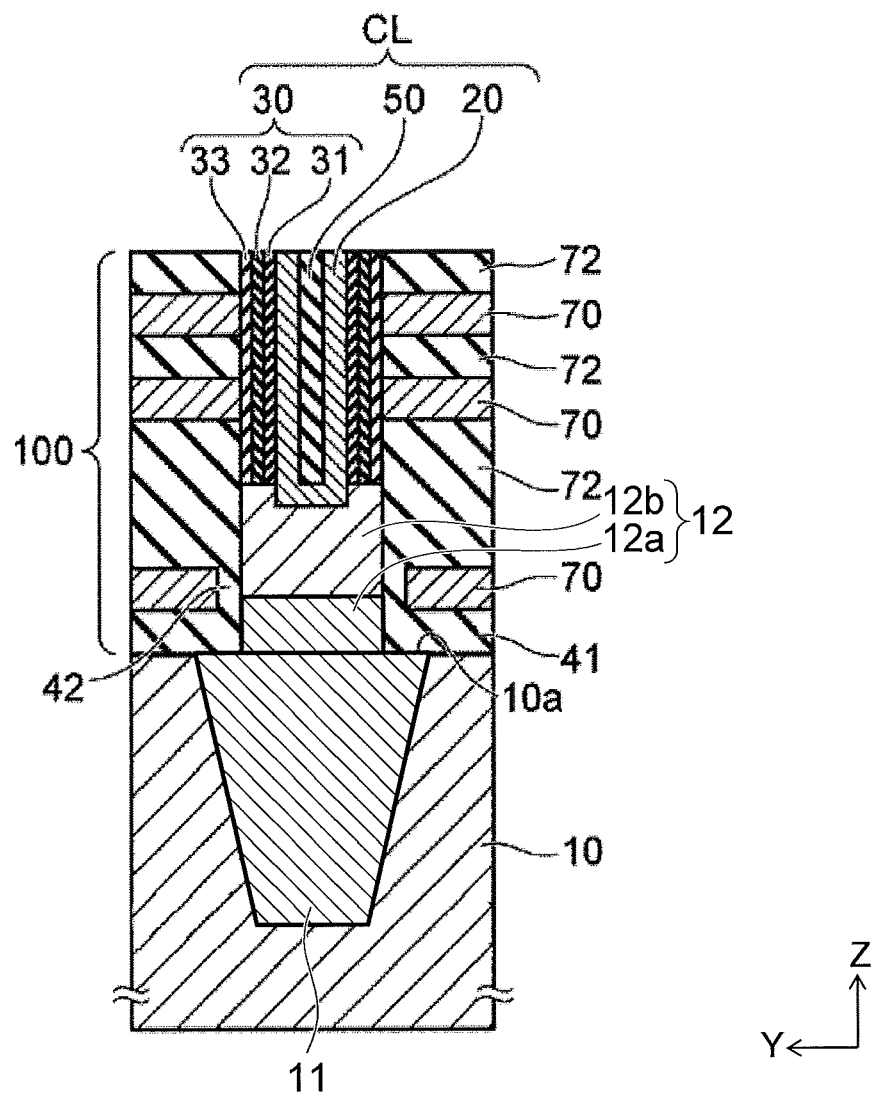
FIG. 15 is a cross sectional view showing a step of forming electrode layers.

After that, as shown in FIG. 15, the electrode layers 70 are formed in the gaps 73. As the electrode layers 70, tungsten layers or molybdenum layers are exemplarily formed, for example, by CVD (Chemical Vapor Deposition).

After the electrode layers 70 are formed, as shown in FIG. 3, the separation parts 60 including the insulating films 61 and the line parts LI are formed in the slits ST. The lower end parts of the line parts LI are in contact with the semiconductor regions 13.

Subsequently to the production steps for the semiconductor device according to the present embodiment as described above, a manufacturing method of a semiconductor device according to a comparative example is described. Production steps different from those for the present embodiment mentioned above are herein described.

Figure 16:
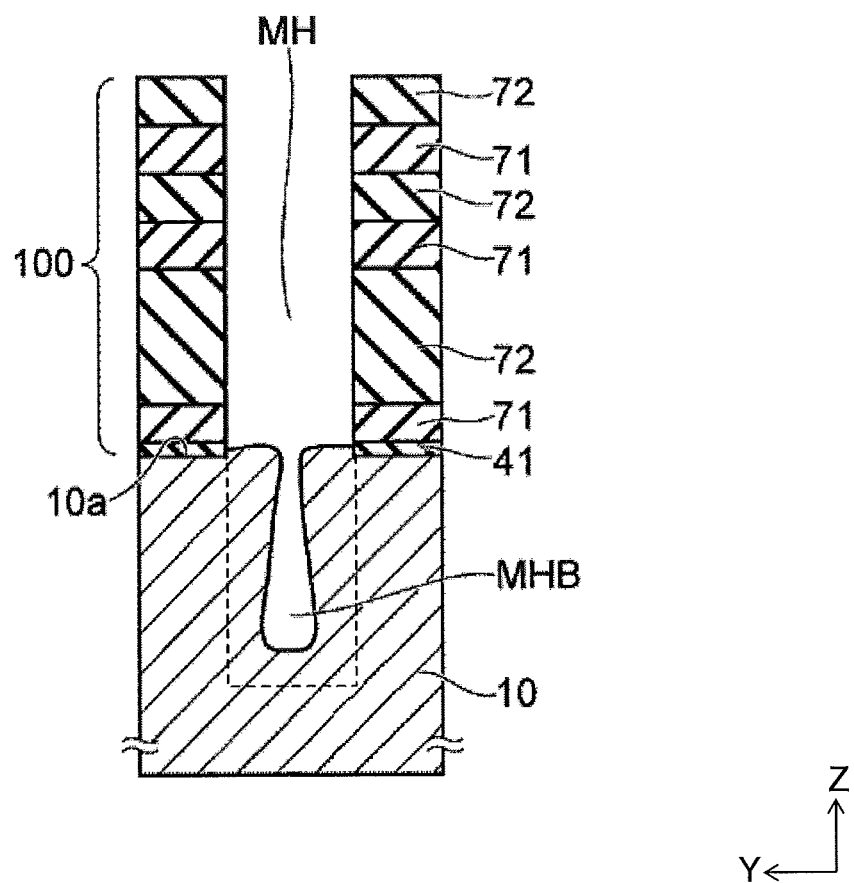
FIG. 16 is a cross sectional view for explaining a manufacturing method of a semiconductor device according to a comparative example.
Figure 17:
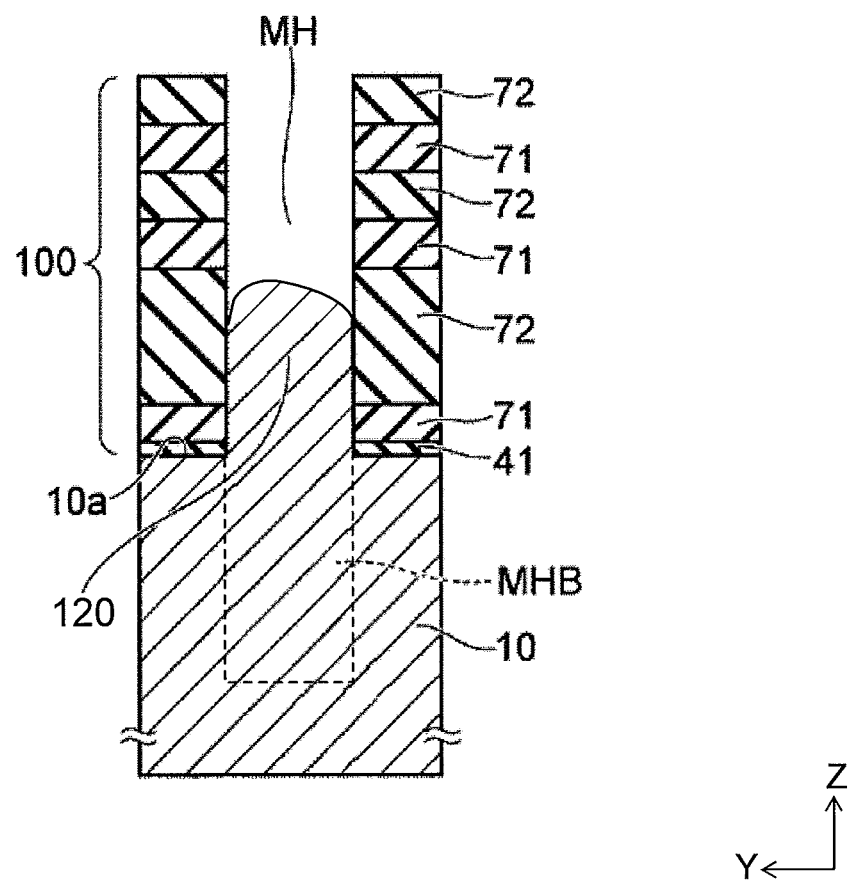
FIG. 17 is a cross sectional view for explaining the manufacturing method of a semiconductor device according to the comparative example.

FIG. 16 and FIG. 17 are cross sectional views for explaining a manufacturing method of a semiconductor device according to a comparative example. In the comparative example, as shown in FIG. 16, subsequently to the formation of the memory holes MH, silicon crystals are epitaxially grown in the bottom regions MHB. In this stage, silicon crystals with various plane orientations are exposed in the bottom regions MHB. Therefore, lattice information of the semiconductor substrate 10 is damaged, and as a result, there can be a case, as shown in FIG. 17, where an upper end of a second contact part 120 has a convex shape. In this case, there can arise a situation that the semiconductor body 20 formed on the second contact part 120 makes no connection to the second contact part 12 or an insufficient connection thereto.

On the contrary, in the present embodiment, it is expected that the upper end of the second contact part 12 can have such a convex shape. Therefore, the bottom region MHB is anisotropically etched in advance before the silicon crystal is epitaxially grown in the memory hole MH. This anisotropic etching allows the length "$d_r$" of the bottom region MHB to expand in the Y-direction relative to the diameter "$d_{MH}$" of the memory hole (see FIG. 8). Moreover, the aforementioned anisotropic etching allows the (111) plane of the silicon crystal to be most exposed on the tapered surface 11a. As a result, as shown in FIG. 10, the upper end of the undoped layer 12b of the second contact part 12 becomes a flat surface. Therefore, a sufficient connection between the semiconductor body 20 and the second contact part 12 can be secured, which can reduce failure in the process. Moreover, successively performing the anisotropic etching, and the epitaxial growth and the doping with boron in the same apparatus and the same furnace enhances the effect of making the upper end of the undoped layer 12b a flat surface.

Moreover, in the present embodiment, boron is injected in the first contact part 11 and a part of the second contact part 12. The boron allows control of a threshold voltage "Vth" of a bottom transistor which is turned on and off by a voltage applied to the lowermost electrode layer 70. Therefore, variation of threshold voltages of bottom transistors can be reduced. Successively performing the anisotropic etching, and the epitaxial growth and the doping with boron in the same apparatus and the same furnace can control a spatial distribution in concentration of boron, which can reduce the variation of the threshold voltages.

Furthermore, the aforementioned regions of injecting boron are limited within the regions of forming the memory holes MH, not across the whole surface of the semiconductor substrate 10. Therefore, an electric resistance of a surface portion of the semiconductor substrate 10 out of a current path of a cell current from the semiconductor region 13 of the separation part 60 to the lower end of the semiconductor body 20 can be reduced to be as low as possible.
(Modification 1)

Figure 18:
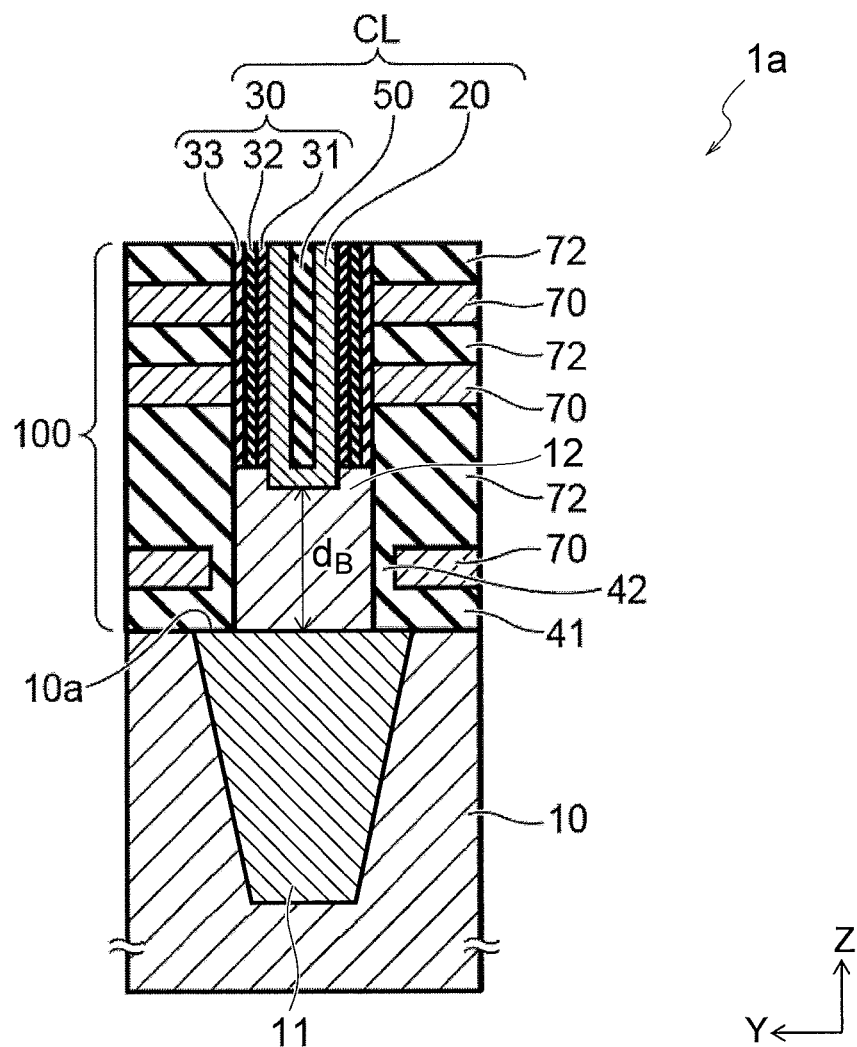
FIG. 18 is a cross sectional view showing a structure of the essential part of a memory cell array according to Modification 1.

FIG. 18 is a cross sectional view showing a structure of the essential part of a memory cell array according to Modification 1. The similar components to those for the aforementioned first embodiment are given the same signs and their detailed description is omitted.

In a memory cell array 1a shown in FIG. 18, boron is contained in the first contact part 11 but not contained in the second contact part 12. Such a second contact part 12 can be formed by ending the doping with boron when the epitaxial growth of the silicon crystal reaches the upper surface 10a of the semiconductor substrate 10.

Since according to the present modification, at least the first contact part 11 is doped with boron, the variation among bottom transistors can be reduced. Furthermore, since in the present modification, the second contact part 12 is not doped with boron, a distance "$d_B$" between a region of doping with boron (first contact part 11) and the semiconductor body 20 is larger than in the first embodiment. Therefore, an electric resistance of the second contact part 12 on the aforementioned current path of the cell current can be reduced.
(Modification 2)

Figure 19:
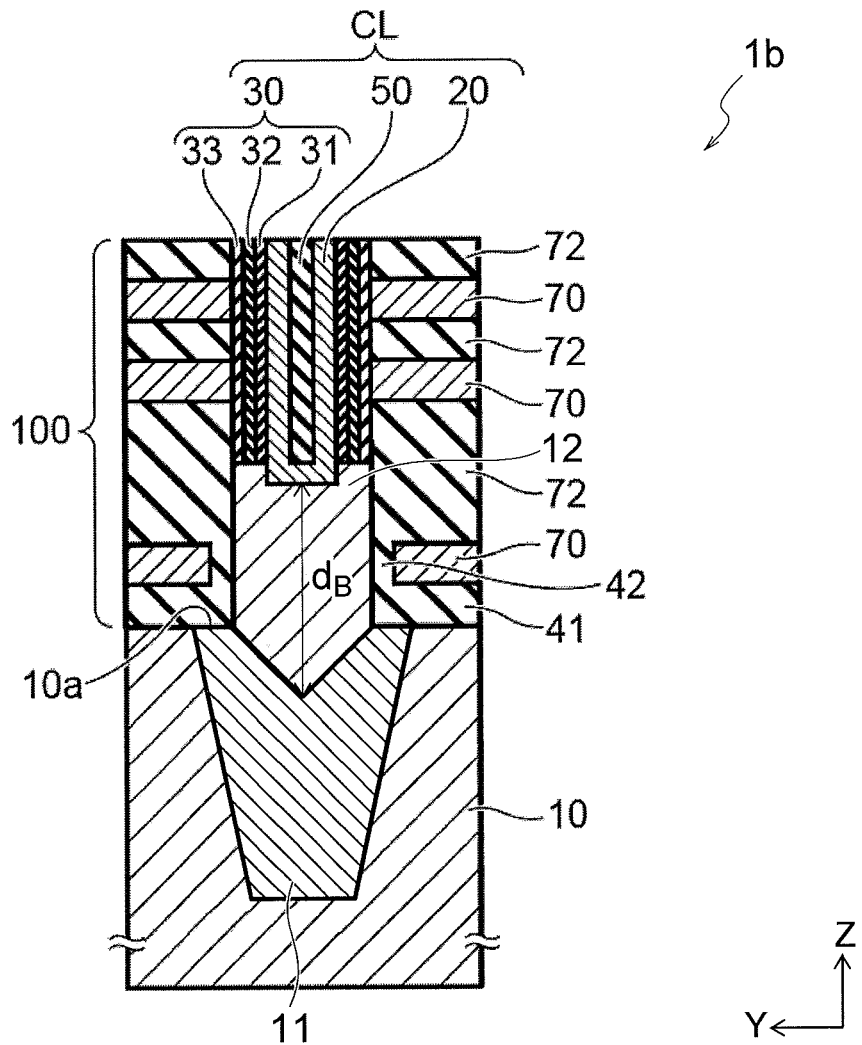
FIG. 19 is a cross sectional view showing a structure of the essential part of a memory cell array according to Modification 2.

FIG. 19 is a cross sectional view showing a structure of the essential part of a memory cell array according to Modification 2. The similar components to those for the aforementioned first embodiment are given the same signs and their detailed description is omitted.

In a memory cell array 1b shown in FIG. 19, boron is not contained in the second contact part 12 similarly to Modification 1. Furthermore, in the present modification, boron is not contained in a region that is in the first contact part 11 and immediately below the second contact part 12 neither. Meanwhile, boron is contained in a region that is in the first contact part 11 and faces the lowermost electrode layer 70. Such a first contact part 11 can be formed by adjusting a time for the doping during the epitaxial growth of the silicon crystal.

Since according to the present modification, a region which is not doped with boron is also formed in a part of the first contact part 11, the distance "$d_B$" between the region of the doping with boron and the semiconductor body 20 is larger than in Modification 1. Therefore, the electric resistance on the aforementioned current path of the cell current can be further reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. A semiconductor device comprising:
a semiconductor substrate including a first surface, a first contact part provided at a deeper level than the first surface, and a second contact part protruding up to a higher level than the first surface from the first contact part;
a stacked body in which insulating layers and electrode layers are alternately stacked on the first surface; and
a semiconductor film extending, on the second contact part, in the stacked body in a first direction perpendicular to the first surface, wherein
at an interface between the first contact part and the second contact part, a length of the first contact part in a second direction parallel to the first surface is larger than a length of the second contact part in the second direction, wherein the second contact part includes tapered sidewall surfaces inclined such that a width of the second contact part in the second direction is larger as coming closer to the stacked body, and a (111) plane of a silicon crystal is exposed on the tapered sidewall surfaces.

2. The semiconductor device according to claim 1, wherein the first contact part contains boron, and the second contact part has a doped layer containing boron and an undoped layer provided on the doped layer and not containing boron.

3. The semiconductor device according to claim 2, wherein an upper end of the doped layer is arranged, in the stacked body, at a level higher than a bottom surface of the lowermost insulating layer and lower than a top surface of the lowermost electrode layer.

4. The semiconductor device according to claim 1, wherein the first contact part contains boron, and the second contact part does not contain boron.

5. The semiconductor device according to claim 4, wherein the boron is contained in a region that is in the first contact part and faces the lowermost electrode layer while not being contained in a region that is in the first contact part and immediately below the second contact part.

6. A manufacturing method of a semiconductor device, comprising:

forming a stacked body in which insulating layers and sacrificial layers are alternately stacked on a first surface of a semiconductor substrate in a first direction perpendicular to the first surface;

forming a hole penetrating the stacked body in the first direction and reaching a deeper level than the first surface;

by anisotropically etching a first portion, of the hole, that is lower than the first surface, making a length of the first portion in a second direction parallel to the first surface larger than a length of a second portion of the hole in the second direction, the second portion being higher than the first surface;

forming a first contact part through crystal growth in the first portion with an identical semiconductor material to that of the semiconductor substrate, and a second contact part through crystal growth in the second portion with the semiconductor material; and forming a semiconductor film on the second contact part in the hole.

7. The manufacturing method of a semiconductor device according to claim 6, comprising forming, on the second contact part, tapered sidewall surfaces which are inclined such that a width of the second contact part in the second direction is larger as coming closer to the stacked body and on which a (111) plane of a silicon crystal is most exposed.

8. The manufacturing method of a semiconductor device according to claim 7, wherein the first contact part is doped with boron, and the second contact part is not doped with boron.

9. The manufacturing method of a semiconductor device according to claim 8, wherein a region that is in the first contact part and faces the lowermost electrode layer is doped with boron while a region that is in the first contact part and immediately below the second contact part is not doped with boron.

10. The manufacturing method of a semiconductor device according to claim 6, comprising:

doping the first contact part with boron; and forming, in the second contact part, a doped layer containing boron and an undoped layer provided on the doped layer and not containing boron.

11. The manufacturing method of a semiconductor device according to claim 10, comprising adjusting a time for the doping with boron such that an upper end of the doped layer is at a level higher than a bottom surface of the lowermost insulating layer and lower than a top surface of the lowermost electrode layer in the stacked body.

* * * * *